(12) United States Patent
Sasabata et al.

(10) Patent No.: US 6,720,850 B2
(45) Date of Patent: Apr. 13, 2004

(54) VARIABLE ATTENUATOR

(75) Inventors: Akihiro Sasabata, Yokohama (JP); Motoyasu Nakao, Sagamihara (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 10/114,391

(22) Filed: Apr. 2, 2002

(65) Prior Publication Data

US 2002/0196098 A1 Dec. 26, 2002

(30) Foreign Application Priority Data

Apr. 10, 2001 (JP) ........................... 2001-111486

(51) Int. Cl.[7] ................................. H01P 1/06
(52) U.S. Cl. .................... 333/261; 333/101; 333/81 R; 327/308
(58) Field of Search ................. 333/103, 101, 333/258, 262, 263, 81 R; 327/308, 268, 283, 290, 427; 455/82, 83, 307, 289, 290

(56) References Cited

U.S. PATENT DOCUMENTS 5,697,069 A * 12/1997 Bohm et al. .............. 455/83
6,281,762 B1 * 8/2001 Nakao et al. .............. 333/103

FOREIGN PATENT DOCUMENTS

| JP | 4-154313 | | 5/1992 |
| JP | 774604 | | 3/1995 |
| JP | 7074604 | * | 3/1995 |
| JP | 114950 | | 4/2002 |

* cited by examiner

*Primary Examiner*—Long Nguyen
(74) *Attorney, Agent, or Firm*—Dickstein, Shapiro, Morin & Oshinsky, LLP.

(57) ABSTRACT

A resonance type SPST switch is formed by connecting an inductive element in series with the drain of an FET, and then by connecting a capacitive element in parallel with the series connection of the FET and the inductive element. A constant-voltage source for feeding a voltage Vs is connected to the source of the FET, and a variable-voltage generator for switching the FET between an on state and a state in the vicinity of pinchoff is connected to the gate of the FET. When the variable-voltage generator feeds a voltage $V\alpha$ in the vicinity of a pinchoff voltage to the gate of the FET, the SPST switch is closed while the amount of attenuation between first and second terminals is variably set. The resulting variable attenuator is thus compact in size, allows a large amount of attenuation to be set, and involves low manufacturing costs.

5 Claims, 9 Drawing Sheets

VARIABLE ATTENUATOR

BACKGROUND OF THE INVENTION

1. Field of the Invention

The present invention relates a variable attenuator for use in an SPST (Single-Pole Single-Throw) switch, an SPDT (Single-Pole Double-Throw) switch, etc, which conducts or blocks a high-frequency signal and, more particularly, to a variable attenuator which provides a variable attenuation to a high-frequency signal during conduction.

2. Description of the Related Art

Known as a high-frequency switch for conducting or blocking a high-frequency signal are resonance type high-frequency switches (as disclosed in Japanese Unexamined Patent Application Publication No. 2000–114950 and its corresponding U.S. Pat. No. 6,281,762), which include a field-effect transistor (hereinafter referred to as an FET), an inductive element, a capacitive element, etc. Such a high-frequency switch switches between a parallel resonance state and a serial resonance state in synchronization with the on and off operation of the FET by appropriately setting inductance of the inductive element and capacitance of the capacitive element. In this way, the conventional high-frequency switch conducts a high-frequency signal at the serial resonance state thereof and blocks the high-frequency signal at the parallel resonance state thereof.

When a variable attenuator for attenuating the high-frequency signal is mounted on the high-frequency switch, an FET for attenuation, separately from the FET forming the high-frequency switch, is connected to the high-frequency switch. In this way, a voltage applied between the gate and the source of the attenuator FET is controlled to control the amount of attenuation of the high-frequency signal conducted between the drain and the source.

In the above conventional art, the high-frequency switch and the variable attenuator are separately produced. For this reason, the entire unit becomes bulky when the high-frequency switch and the variable attenuator are produced on an MMIC (Monolithic Microwave Integrated Circuit) fabricated of an expensive material such as GaAs, and the manufacturing cost of the switch increases. Since the amount of attenuation is set by the attenuating FET only, a large amount of attenuation cannot be set.

SUMMARY OF THE INVENTION

The present invention has been developed in view of the above problem and it is an object of the present invention to provide a variable attenuator which sets a large amount of attenuation, involves a low manufacturing cost, and has a compact overall size.

To resolve the above problem, a variable attenuator of the present invention in one aspect includes an FET, an inductive element connected to one of the source and the drain of the FET, a capacitive element connected in parallel with the series connection of the inductive element and the FET, a first terminal and a second terminal respectively connected to both ends of the capacitive element, and an attenuation setting unit which variably sets the amount of attenuation to a signal transmitted across the first terminal and the second terminal by varying the gate voltage of the FET.

In this arrangement, the circuit between the two terminals is broken when the FET is turned on, and the circuit between the two terminals is made when the FET is turned off. With the FET set in the vicinity of pinchoff to achieve a conductive state between the two terminals, the attenuation setting unit variably sets the amount of attenuation.

Since the attenuator is formed of a resonance type SPST switch including the FET, the inductive element, and the capacitive element, the attenuator has a wide range of attenuation and a large amount of attenuation compared with the case in which an attenuator is formed of an FET alone.

Preferably, the variable attenuator further includes a constant-voltage source, connected to one of the source and the drain of the FET, for supplying a constant voltage, wherein the attenuation setting unit is a variable-voltage generator which is connected to the gate of the FET to variably set the gate voltage of the FET.

The voltage difference between the constant voltage provided by the constant-voltage source and the voltage provided by the variable-voltage generator is applied to the FET as a gate voltage (a gate-source voltage or a gate-drain voltage), thereby variably setting the amount of attenuation between the two terminals.

Preferably, the gate of the FET is grounded, and the attenuation setting unit is a variable-voltage generator which is connected to one of the source and the drain of the FET to variably set the voltage of one of the source and the drain of the FET.

The voltage difference between the ground voltage and the voltage provided by the variable-voltage generator is applied to the FET as the gate voltage, thereby variably setting the amount of attenuation between the two terminals. For this reason, the amount of attenuation is set by connecting the single variable-voltage generator to the one of the source and the drain of the FET.

A variable attenuator of the present invention in another aspect includes a first FET, a first inductive element connected to one of the source and the drain of the first FET, a first capacitive element connected in parallel with the series connection of the first inductive element and the first FET, a second FET, a second inductive element connected to one of the source and the drain of the second FET, a second capacitive element connected in parallel with the series connection of the second inductive element and the second FET, a first terminal connected to each end of the first capacitive element and the second capacitive element, a second terminal connected to the other end of the first capacitive element, a third terminal connected to the other of the second capacitive element, a voltage switch which makes or breaks the circuit between the first terminal and the third terminal by varying the gate voltage of the second FET, and an attenuation setting unit which variably sets the amount of attenuation to a signal transmitted across the first terminal and the second terminal by varying the gate voltage of the first FET.

In this arrangement, the circuit between the first terminal and the third terminal is broken when the voltage switch turns on the second FET, and the circuit between the first terminal and the third terminal is made when the voltage switch turns off the second FET. The circuit between the first terminal and the second terminal is broken when the attenuation setting unit turns on the first FET, and the circuit between the first terminal and the second terminal is made when the attenuation setting unit turns off the first FET. In this way, the signal transmitted across the two terminals is attenuated by causing the attenuation setting unit to operate the first FET in the vicinity of pinchoff during the conductive state of the attenuator.

A variable attenuator of the present invention in yet another aspect includes one FET, an inductive element connected to one of the source and the drain of the one FET, a capacitive element connected in parallel with the series connection of the inductive element and the one FET, another FET with one of the source and the drain thereof connected to the node of the capacitive element and the one FET, a first terminal connected to the node of the capacitive element and the one FET, a second terminal connected to the other end of the capacitive element opposite from the first terminal with respect to the capacitive element, a third terminal connected to the other end of the other FET opposite from the first terminal with respect to the other FET, and an attenuation setting unit which variably sets the amount of attenuation to a signal transmitted across the first terminal and the second terminal by varying the gate voltage of the two FETs.

In this arrangement, the circuit between the first terminal and the second terminal is broken and the circuit between the first terminal and the third terminal is made when the attenuation setting unit causes the two FETs to turn on. The circuit between the first terminal and the second terminal is made and the circuit between the first terminal and the third terminal is broken when the attenuation setting unit causes the two FETs to turn off.

A resonance type SPST switch is formed of the FET, the inductive element, and the capacitive element. The attenuation setting unit operates the FET of the SPST switch in the vicinity of pinchoff, and thus the amount of attenuation between the first terminal and the second terminal is variably set. When the SPST switch operates in coordination with the other FET, the attenuation setting unit increases the impedance of the SPST switch, thereby reducing the impedance of the other FET. When the attenuation setting unit reduces the impedance of the SPST switch, the impedance of the other FET is increased. This arrangement controls variations in the impedance with respect to the first terminal.

Preferably, the variable attenuator further includes another inductive element connected between the drain and source of the other FET in parallel with the other FET.

When the other FET is turned off, the off capacitance of the other FET and the other inductive element resonate in parallel, thereby increasing the isolation between the first terminal and the third terminal.

Preferably, the gates of the two FETs are grounded, and the attenuation setting unit is a variable-voltage generator which is connected to the first terminal for connecting the two FETs and variably sets the voltage of one of the source and the drain of each of the two FETs.

In this way, the voltage difference between the ground voltage and the voltage of the variable-voltage generator is supplied to the two FETs, thereby variably setting the amount of attenuation between the first terminal and the second terminal. For this reason, the amount of attenuation is set by connecting the single variable-voltage generator to the sources or the drains of the two FETs.

Preferably, one of the second terminal and the third terminal is grounded, and an SPST switch is formed between the other of the second terminal and the third terminal, and the first terminal.

When the third terminal is grounded, for example, the circuit between the first terminal and the third terminal is broken while the circuit between the first terminal and the second terminal is made. The circuit between the first terminal and the third terminal is made while the circuit between the first terminal and the second terminal is broken, and the first terminal is grounded. For this reason, the degree of isolation between the conductive state between the first and second terminals and the non-conductive state between the first and second terminals increases thereby widening a range in which attenuation varies.

Preferably, an SPDT switch is formed of a plurality of SPST switches in series connection.

Since the SPDT switch is formed from a plurality of SPST switches, power transmitted thereacross is increased.

A variable attenuator of the present invention in still another aspect includes a plurality of SPST modules in parallel connection, an SPST module including an FET, an inductive element connected to one of the source and the drain of the FET, a capacitive element connected in parallel with the series connection of the inductive element and the FET, and a first terminal and a second terminal respectively connected to both ends of the capacitive element, and an attenuation setting unit for variably setting the amount of attenuation on a signal transmitted across the first terminal and the second terminal by varying the gate voltage of the FET.

Since the power transmitted across the terminals is increased, a larger power is attenuated.

Other features and advantages of the present invention will become apparent from the following description of the invention which refers to the accompanying drawings.

BRIEF DESCRIPTION OF THE DRAWING(S)

FIG. 1 is an electronic circuit diagram of an SPST switch in which a variable attenuator in accordance with a first embodiment of the present invention is implemented;

FIG. 2 plots the relationship between the frequency and the transmission characteristics of the SPST switch illustrated in FIG. 1;

DETAILED DESCRIPTION OF EMBODIMENTS OF THE INVENTION

Variable attenuators of the embodiments of the present invention are discussed below with reference to the drawings.

Figure 1:
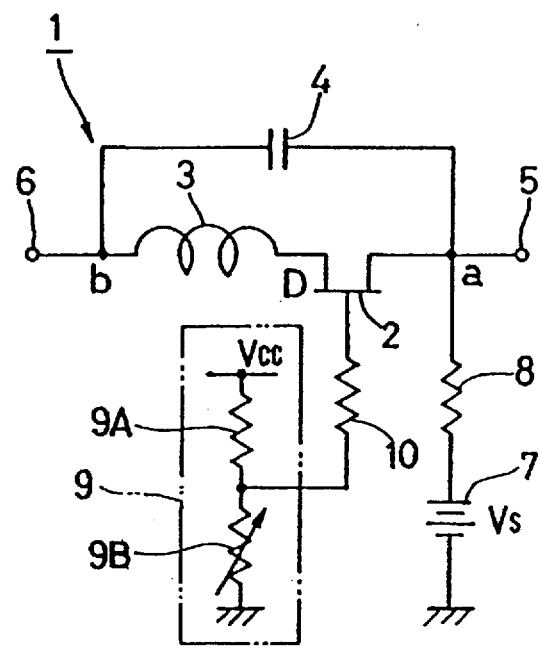
Figure 2:
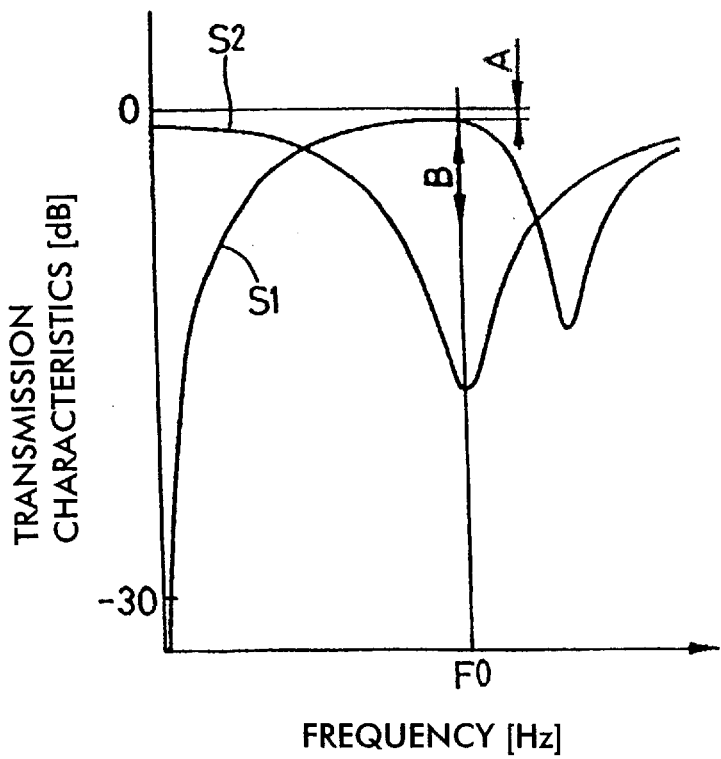

FIG. 1 and FIG. 2 illustrate an SPST switch into which a variable attenuator of a first embodiment of the present invention is incorporated.

As shown, an SPST switch 1 includes an FET 2 later discussed, an inductive element 3, and a capacitive element 4.

The FET 2, making or breaking the circuit of the SPST switch 1, is configured with the drain thereof connected in series with the inductive element 3 discussed later and with the gate thereof connected to a variable-voltage generator 9. The FET 2 has a small resistance Ron during an on operation thereof and an off capacitance Coff during an off operation thereof. As for the terminals of the FET 2 as shown in FIG. 1, the drain only is labeled D, and the source and gate of the FET 2 are not labeled, and the same is true of FIG. 3 and other drawings.

The inductive element 3, connected in series with the FET 2, is configured with one end thereof connected to the drain of the FET 2 and with the other end thereof connected to the capacitive element 4. The inductive element 3 has an inductance L which resonates with the off capacitance Coff of the FET 2 at a signal frequency of F0.

The capacitive element 4, connected in parallel with a series connection of the FET 2 and the inductive element 3, is configured with one end (a node a) connected to the source of the FET 2 and with the other end (a node b) connected to the other end of the inductive element 3. The capacitive element 4 has a capacitance C approximately equal to the off capacitance Coff of the FET 2.

Terminals 5 and 6 are respectively first and second terminals connected to both ends (the nodes a and b) of the capacitive element 4, and also the first and second terminals 5 and 6, respectively connected to an antenna and a transmitter circuit, respectively, receive and output high-frequency signals.

A constant-voltage source 7 is connected to the source of the FET 2 and the first terminal 5 (the node a) through a resistor 8. The constant-voltage source 7 supplies the source of the FET 2 with a voltage Vs as high as 3 V or so.

For example, the variable-voltage generator 9, connected to the gate of the FET 2, includes a fixed resistor 9A and a variable resistor 9A connected in series to divide a voltage Vcc as high as 3 V or so. The variable-voltage generator 9 is configured with the output terminal thereof connected to the gate of the FET 2 through a resistor 10. With the resistance of the variable resistor 9B, the variable-voltage generator 9 switches between a voltage Vα in the vicinity of the pinchoff voltage and the voltage Vcc, thereby applying one of the voltages Vα and Vcc to the gate of the FET 2.

The SPST switch 1 of the first embodiment has the construction described above, and the operation of the SPST switch 1 is discussed below referring to FIG. 1 and FIG. 2.

To open the SPST switch 1, the variable-voltage generator 9 feeds, to the gate of the FET 2, the voltage Vcc approximately equal to a source voltage Vs of the FET 2. The FET 2 becomes conductive, presenting a resistance equivalent to a negligibly small resistance Ron. Connected in parallel between the first terminal 5 and the second terminal 6 are the inductive element 3 and the capacitive element 4. Since the inductive element 3 and the capacitive element 4 resonate at the frequency F0, the impedance between the first terminal 5 and the second terminal 6 becomes infinite, thereby opening the SPST switch 1.

To close the SPST switch 1, the variable-voltage generator 9 feeds, to the gate of the FET 2, a voltage Vα in the vicinity of the pinchoff voltage of the FET 2. The voltage Vα is set to fall within a voltage range from the pinchoff to the off state of the FET 2. The FET 2 becomes almost nonconductive, and becomes almost equivalent to a capacitive element having an off capacitance Coff. Since the inductive element 3 and the off capacitance Coff of the FET 2 resonate serially at the frequency F0, reducing the impedance between the first terminal 5 and the second terminal 6 to almost zero, and thereby closing the SPST switch 1.

When the SPST switch 1 is closed the variable-voltage generator 9 feeds, to the gate of the FET 2, the voltage Vα in the vicinity of the pinchoff voltage of the FET 2. Although the FET 2 is almost non-conductive, the capacitance of the FET 2 deviates slightly from the off capacitance Coff. The impedance between the first terminal 5 and the second terminal 6 becomes higher than when the FET 2 is supplied with the off voltage, thereby attenuating a high-frequency signal traveling across the first terminal 5 and the second terminal 6. The variable-voltage generator 9 variably sets the amount of attenuation A shown in FIG. 2 by appropriately setting the voltage applied to the gate of the FET 2 with the SPST switch 1 closed.

The SPST switch 1 of the first embodiment is of a resonance type that is opened or closed by switching between the parallel resonance state and the serial resonance state in coordination with the on state and the off state of the FET 2. When the SPST switch is opened or closed, the degree of isolation (the difference between characteristic curves S1 and S2 in FIG. 2) is larger than the case when a single FET only is employed. By variably setting the gate voltage (the gate-source voltage) of the FET 2 with the variable-voltage generator 9, the amount of isolation A between the terminal 5 and the terminal 6 is varied within a range of isolation as indicated by an arrow B, and the amount of isolation A is thus variably set. In comparison with the case in which an attenuator is formed of a single FET, this embodiment expands the setting range of the amount of isolation A, while increasing the magnitude of the amount of isolation A.

The variable-voltage generator 9 is connected to the FET 2 in the first embodiment, and when the FET 2 is turned on, the circuit between the terminal 5 and the terminal 6 is opened, and when the FET 2 is driven close to the pinchoff, the circuit between the terminal 5 and the terminal 6 is closed. Since the variable-voltage generator 9 drives the FET 2 close to the pinchoff, the amount of attenuation A is variably set with the SPST switch 1 in the conductive state.

Since the attenuator is integrated into the SPST switch 1, there is no need for separately arranging an attenuating FET as in the conventional are, and the attenuator becomes compact in size, and involves low manufacturing costs.

Since the attenuator is formed of a resonance type SPST switch 1, the setting range of the amount of attenuation A is expanded more and the magnitude of the amount of attenuation A becomes greater compared with the case in which an attenuator is formed of a single FET.

Figure 3:
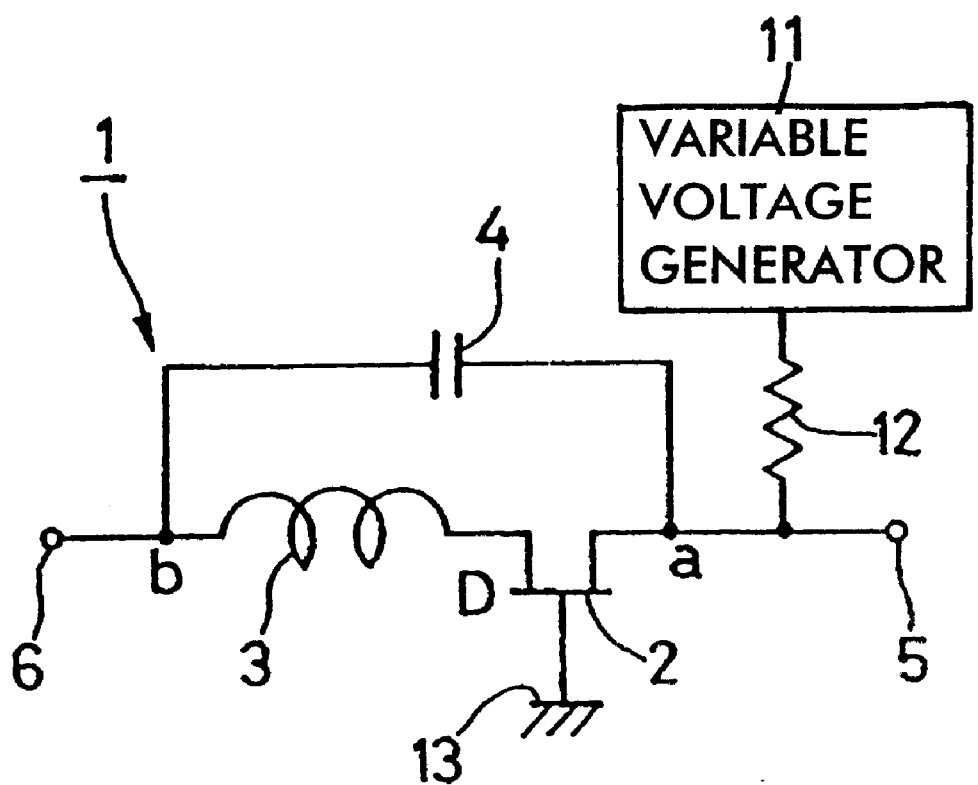
FIG. 3 is an electronic circuit diagram of an SPST switch in which a variable attenuator in accordance with a second embodiment of the present invention is implemented.

FIG. 3 illustrates an attenuator in accordance with a second embodiment of the present invention, and the feature of the second embodiment lies in that a variable-voltage generator is connected to the source of an FET, and that the gate of the FET is grounded. In the second embodiment, components identical to those described in connection with the first embodiment are designated with the same reference numerals, and the discussion thereof is omitted here.

A variable-voltage generator 11, connected to the source of the FET 2, is configured with the output terminal thereof connected to the source of the FET 2 through a resistor 12. The variable-voltage generator 11 switches between a voltage Vα in the vicinity of the pinchoff voltage of the FET 2 and the ground voltage (0 V), thereby feeding one of the voltage Vα and the ground voltage to the source of the FET 2.

In the second embodiment, the gate of the FET 2 is connected to a ground 13. In this way, the gate of the FET 2 is maintained at the ground voltage.

The variable attenuator of the second embodiment provides the same advantages as those of the first embodiment. Since the FET 2 is configured with the gate thereof connected to the ground 13 and with the source thereof connected to the variable-voltage generator 11, the variable-voltage generator 11 feeds, to the source of the FET 2, the voltage Vα or the ground voltage, thereby varying the voltage difference (the gate voltage) between the gate and source of the FET 2, and thereby switching the FET 2 between the off state and the on state. In comparison with the first embodiment, the second embodiment is simple in structure and involves low manufacturing costs because only the source of the FET 2 is biased.

Figure 4:
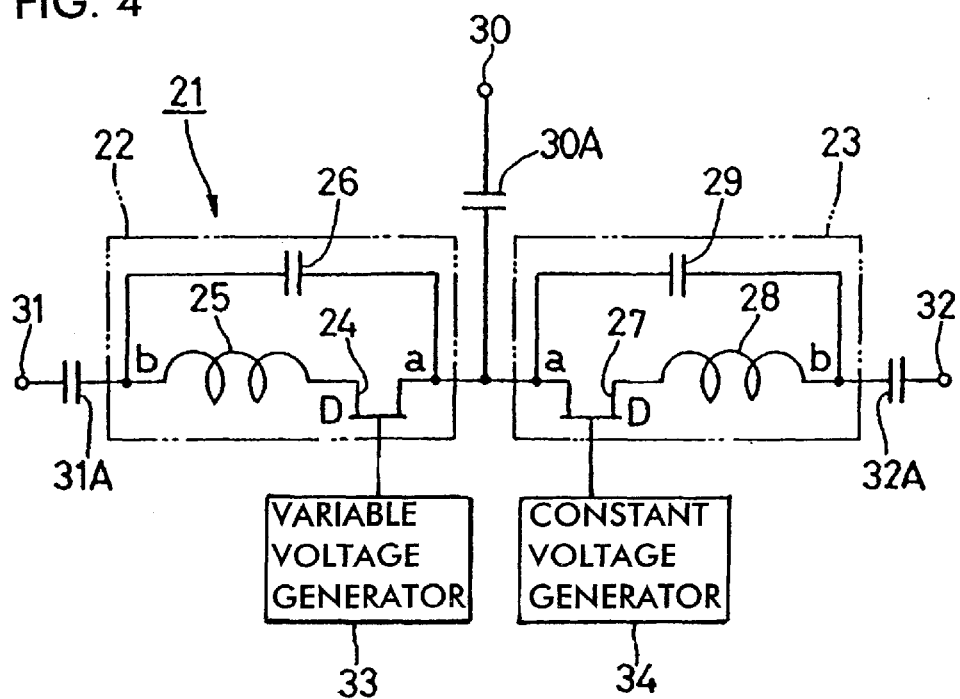
FIG. 4 is an electronic circuit diagram of an SPDT switch in which a variable attenuator in accordance with a third embodiment of the present invention is implemented.

FIG. 4 illustrates a variable attenuator of a third embodiment of the present invention, and the feature of the third embodiment lies in that the variable attenuator is incorporated in an SPDT switch. In the third embodiment, components identical to those described in connection with the first embodiment are designated with the same reference numerals, and the discussion thereof is omitted here.

An SPDT switch 21 is produced by connecting in series first and second SPST switches 22 and 23, each of which has a construction identical to that of the SPST switch 1 in the first embodiment.

A first FET 24, forming the first SPST switch 22, is configured with the drain thereof connected in series with an inductive element 25 discussed later, the gate thereof connected to a variable-voltage generator 33, and the source thereof connected to a source of a second FET 27. In the on state thereof, the first FET 24 becomes equivalent to a resistor having a small resistance Ron1, while in the off state thereof, the first FET 24 becomes equivalent to a capacitive element having an off capacitance Coff1.

A first inductive element 25, connected in series with the first FET 24, is configured with one end thereof connected to the drain of the first FET 24 and with the other end thereof connected to a capacitive element 26. The inductive element 25 has an inductance L1, which resonates with the off capacitance Coff1 of the first FET 24 at a signal frequency.

The capacitive element 26, connected in parallel with the series connection of the first FET 24 and the inductive element 25, is configured with one end thereof (a node a) connected to the source of the first FET 24, and the other end (a node b) thereof connected to the other end of the inductive element 25. The capacitive element 26 has a capacitance C1 equal to the off capacitance Coff1 of the FET 24.

The second FET 27, forming the second SPST 23, is configured with the drain thereof connected in series with an inductive element 28, with the gate thereof connected to a constant-voltage generator 34 for switching the second FET 27 between the on state and the off state, and with the source thereof connected to the source of the first FET 24. The FET 27 becomes equivalent to a resistor having a small resistance Ron2 in the on-state thereof, while becoming equivalent to a capacitive element having an off capacitance Coff2 in the off state thereof.

The second inductive element 28, connected in series with the second FET 27, is configured with one end thereof connected to the drain of the second FET 27 and with the other end thereof connected to a capacitive element 29. The inductive element 28 has an inductance L2, which resonates with the off capacitance Coff2 of the second FET 27 at the signal frequency.

The capacitive element 29, connected in parallel with the series connection of the second FET 27 and the second inductive element 28, is configured with one end thereof (a node a) connected to the sources of the first FET 24 and the second FET 27, and the one end of the capacitive element 26, and with the other end thereof (a node b) connected to the other end of the second inductive element 28. The capacitive element 29 has a capacitance C2 equal to the off capacitance of the second FET 27.

A first terminal 30 is connected to ends (nodes a and a) of the first and second capacitive elements 26 and 29, a second terminal 31 is connected to the other end (a node b) of the first capacitive element 26, a third terminal 32 is connected to the other end (a node b) of the capacitive element 29, and DC blocking capacitors 30A, 31A and 32A are respectively connected to the terminals 30-32.

The variable-voltage generator 33, connected to the gate of the first FET 24, switches between the voltage Vα in the vicinity of the pinchoff voltage of the first FET 24 and the ground voltage (0 V), thereby feeding one of the voltage Vα and the ground voltage to the gate of the first FET 24.

As a voltage switch, the constant-voltage generator 34, connected to the gate of the second FET 27, switches between the ground voltage (0 V) as the off voltage of the second FET 27 and a voltage Vcc as high as 3 V, as the on voltage of the second FET 27, and feeds one of the ground voltage and the voltage Vcc to the gate of the second FET 27.

The SPDT switch 21 of the third embodiment is constructed as above, and the operation thereof is discussed below referring to Table 1.

To close the SPST switch 22 and to open the SPST switch 23, the variable-voltage generator 33 feeds, to the gate of the first FET 24, the voltage Vα in the vicinity of the pinchoff voltage of the first FET 24, and the constant-voltage generator 34 feeds the ground voltage to the second FET 27. The first FET 24 becomes almost non-conductive, thereby causing the first inductive element 25 and the off capacitance Coff1 of the first FET 24 to resonate serially at a signal frequency, and the second FET 27 is turned on, thereby causing the second inductive element 28 and the capacitive element 29 to resonate in parallel at a signal frequency. Thus, the impedance between the first and second terminals 30 and 31 drops to almost zero, thereby closing the SPST switch 22, and the impedance between the first and third terminals 30 and 32 reaches almost infinity, thereby opening the SPST switch 23.

Since the voltage Vα in the vicinity of the pinchoff voltage is fed to the gate of the first FET 24, the FET 24 becomes almost non-conductive, and the capacitance thereof slightly deviates from the off capacitance Coff1. As a result, the impedance between the first and second terminals 30 and 31 rises higher than when the off voltage is applied to the first FET 24, and a high-frequency signal traveling across the first and second terminals 30 and 31 is thus attenuated.

On the other hand, to open the SPST switch 22 and to close the second SPST switch 23, the variable-voltage generator 33 feeds the ground voltage to the gate of the first FET 24 and the constant-voltage generator 34 feeds the voltage Vcc as high as 3 V or so to the second FET 27. The first FET 24 is thus turned on, causing the inductive element 25 and the capacitive element 26 to resonate in parallel at the signal frequency, and the second FET 27 is turned off, thereby causing the inductive element 28 and the off capacitance Coff2 of the second FET 27 to resonate serially at the signal frequency. In this way, the impedance between the first and second terminals 30 and 31 reaches almost infinity, thereby opening the SPST switch 22, while the impedance between the first and third terminals 30 and 32 becomes almost zero, thereby closing the SPST switch 23.

TABLE 1

|  | Gate voltage of FET 24 | Gate voltage of FET 27 |
|---|---|---|
| Terminals 1-2: SW (ON) Terminals 1-3: SW (OFF) | Vα [V] | 0 [V] |
| Terminals 1-2: SW (OFF) Terminals 1-3: SW (ON) | 0 [V] | Vcc [V] |

The attenuator of the third embodiment provides the same advantages as those of the first embodiment. In accordance with the third embodiment, the SPDT switch 21 with the variable attenuator is easily formed by connecting the variable-voltage generator 33 to an SPDT switch 21 which is substantially identical to the conventional art.

Figure 5:
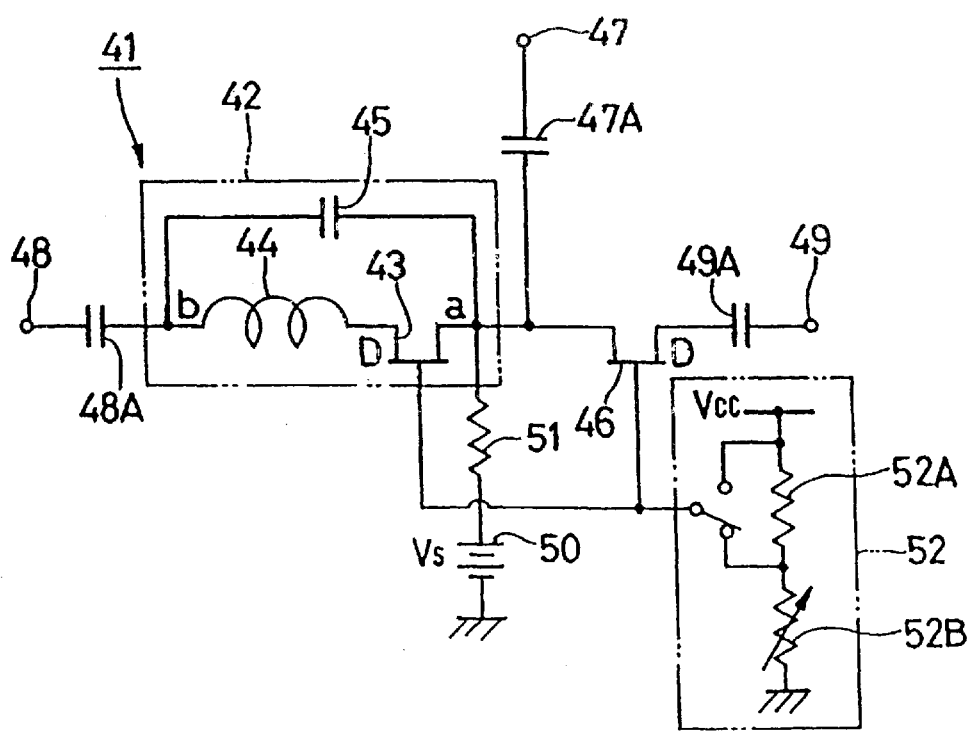
FIG. 5 is an electronic circuit diagram of an SPDT switch in which a variable attenuator in accordance with a fourth embodiment of the present invention is implemented.

FIG. 5 illustrates a fourth embodiment in which a variable attenuator is incorporated in an SPDT switch, and the feature of the fourth embodiment lies in that the SPDT switch is constructed by connecting an FET in series with the SPST switch.

An SPDT switch 41 is constructed by connecting an FET 46 in series with an SPST switch portion 42.

The SPST switch portion 42 includes an FET 43, an inductive element 44, and a capacitive element 45 substantially identical to the FET 2, the inductive element 3, and capacitive element 4 used in the SPST switch 1. One end of the inductive element 44 is connected to the drain of the FET 43 and the capacitive element 45 is connected in parallel with the series connection of the FET 43 and the inductive element 44.

The FET 46, which is the other FET connected in series with the SPST switch portion 42, is configured with the source thereof connected to the source of the FET 43.

A first terminal 47 is connected to a node a of the capacitive element 45 and the FET 43, a second terminal 48 is connected to the other end of the capacitive element 45 opposite from the first terminal 47 with respect to the capacitive element 45 (a node b), a third terminal 49 is connected to the other end of the other FET 46 opposite from the first terminal 47 with respect to the FET 46, and these terminals 47–49 are respectively connected to DC blocking capacitive elements 47A–49A.

A constant-voltage source 50 is connected to the sources of the FETs 43 and 46 and the first terminal 47 (the node a) through a resistor 51. The constant-voltage source 50 feeds the sources of the FETs 43 and 46 with a voltage Vs as high as 3 V or so.

Like the variable-voltage generator 9 in the first embodiment, a variable-voltage generator 52, connected to the gates of the FETs 43 and 46, is formed of a fixed resistor 52A and a variable resistor 52B. The variable-voltage generator 52 switches between a voltage Vα in the vicinity of the pinchoff voltage of the FETs 43 and 46 and a voltage Vcc, thereby feeding the voltage Vα or Vcc to the gates of the FETs 43 and 46.

The operation of the SPDT switch 41 of the fourth embodiment thus constructed is discussed with reference to Table 2.

To close the SPST switch portion 42 and to open the FET 46, the variable-voltage generator 52 feeds the voltage Vα in the vicinity of the pinchoff voltage of the FETs 43 and 46 to the gates of the FETs 43 and 46. The FET 43 becomes almost non-conductive, thereby causing the inductive element 44 and the off capacitance of the FET 43 to resonate serially at a signal frequency, and the other FET 46 is turned off. In this way, the impedance between the first and second terminals 47 and 48 drops to almost zero, thereby closing the SPST switch portion 42, while the FET 46 between the first and third terminals 47 and 49 is opened.

Since the voltage Vα in the vicinity of the pinchoff voltage is fed to the gate of the FET 43, the impedance between the first and second terminals 47 and 48 rises higher than when the FET 43 is supplied with the off voltage, and the high-frequency signal traveling across the first and second terminals 47 and 48 is attenuated.

To open the SPST switch portion 42 and to close the FET 46, the variable-voltage generator 52 feeds the voltage Vcc as high as 3 V or so to the gates of the FETs 43 and 46. In this way, the FET 43 is turned on, causing the inductive element 44 and the capacitive element 45 to resonate in parallel at the signal frequency, and the other FET 46 is turned on. In this way, the impedance between the first and second terminals 47 and 48 becomes almost infinite, opening the SPST switch portion 42, while the FET 46 between the first and third terminals 47 and 49 is closed.

TABLE 2

|  | Gate voltage of FETs 43 and 46 |
|---|---|
| Terminals 1-2: SW (ON) Terminals 1-3: SW (OFF) | Vα [V] |
| Terminals 1-2: SW (OFF) Terminals 1-3: SW (ON) | Vcc [V] |

The variable attenuator of the fourth embodiment provides the same advantages as those of the third embodiment. In the fourth embodiment, however, the SPST switch portion 42 and the FET 46 are serially connected, while the variable-voltage generator 52 is connected to the gate of the FET 43 in the SPST switch portion 42 and the gate of the FET 46, and the fourth embodiment offers a simple construction and reduces manufacturing costs in comparison with the above-referenced third embodiment because the SPDT switch is switched over by controlling a single voltage.

Since the variable-voltage generator 52 is connected to the gate of the FET 43 in the SPST switch portion 42 and the gate of the FET 46, the SPST switch portion 42 and the FET 46 concurrently operate. Specifically, by switching the voltage output from the variable-voltage generator 52 from the voltage Vα to the voltage Vcc, the FET 46 is switched from the opened state to the closed state at the same moment the SPST switch portion 42 is switched from the closed state to the opened state.

By increasing the impedance of the SPST switch portion 42, the impedance of the FET 46 drops, and by decreasing the impedance of the SPST switch portion 42, the impedance of the FET 46 rises. The variations in the impedance with respect to the first terminal 47 are controlled more than in the third embodiment in which the two SPST switch portions are individually switched.

Figure 6:
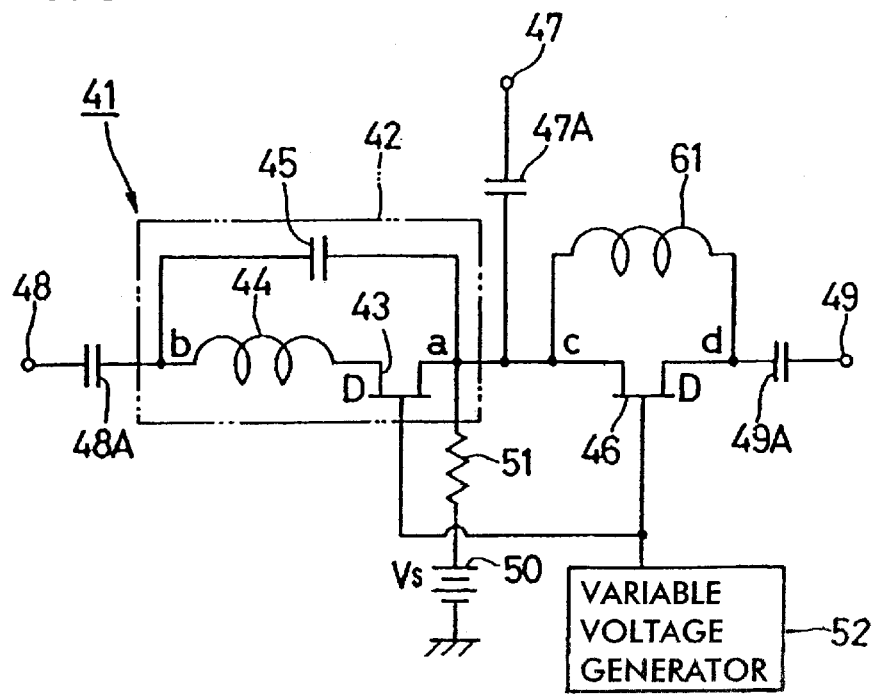
FIG. 6 is an electronic circuit diagram of an SPDT switch in which a variable attenuator in accordance with a fifth embodiment of the present invention is implemented.

FIG. 6 illustrates an SPDT switch with a variable attenuator in accordance with a fifth embodiment, and the feature of the fifth embodiment lies in that an FET is connected in series with an SPST switch portion and that an inductive element is connected in parallel with the FET. In the fifth embodiment, components identical to those described in connection with the fourth embodiment are designated with the same reference numerals and the discussion thereof is omitted here.

An inductive element 61, connected in parallel with the FET 46, is configured with both ends thereof (nodes c and d) respectively connected to the source and drain of the FET 46. The inductive element 61 has an inductance 13, which resonates with the off capacitance Coff3 of the FET 46 at a signal frequency.

The variable attenuator of the fifth embodiment provides the same advantages as those of the fourth embodiment. Since the inductive element 61 is connected in parallel with the FET 46 in the fifth embodiment, the off capacitance Coff3 of the FET 46 and the inductive element 61 resonate in parallel when the FET 46 is turned off. The degree of isolation between the first and third terminals 47 and 49 is large in comparison with the fourth embodiment in which the FET 46 is used solely without the inductive element 61.

Figure 7:
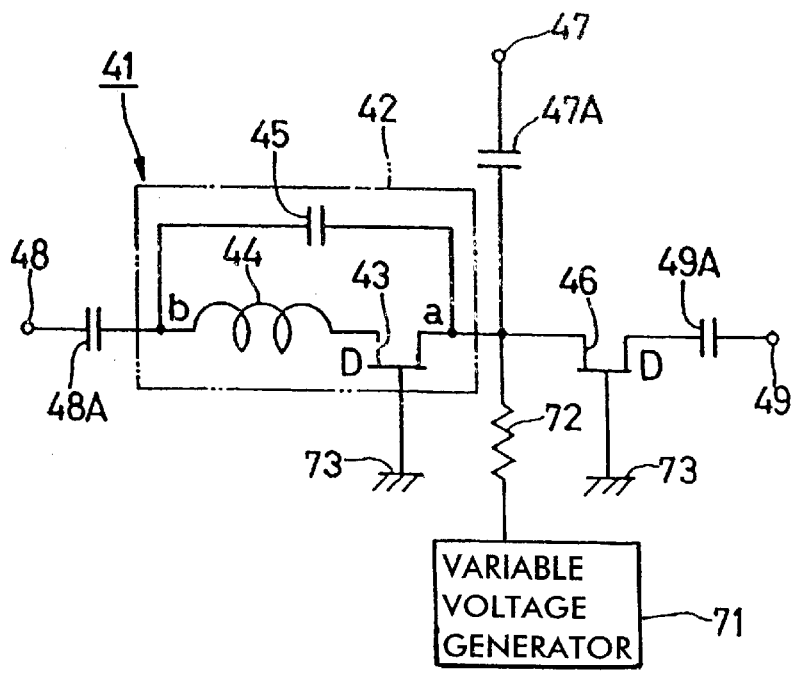
FIG. 7 is an electronic circuit diagram of an SPDT switch in which a variable attenuator in accordance with a sixth embodiment of the present invention is implemented.

FIG. 7 illustrates an SPDT switch with a variable attenuator in accordance with a sixth embodiment, and the feature of the sixth embodiment lies in that an FET is connected in series with an SPST switch and that a variable-voltage generator is connected to the node of the SPST switch and the FET. In the sixth embodiment, components identical to those described in connection with the fourth embodiment are designated with the same reference numerals, and the discussion thereof is omitted here.

The output terminal of a variable-voltage generator 71 is connected to the sources (a node a) of FETs 43 and 46 through a resistor 72. The variable-voltage generator 71 switches between a voltage Vα in the vicinity of the pinchoff voltage of the FET 43 and the ground voltage (0 V), thereby feeding the voltage Vα or the ground voltage to the sources of the FETs 43 and 46.

In this embodiment, the gates of the FETs 43 and 46 are connected to ground 73. The gates of the FETs 43 and 46 are thus fixed to the ground voltage.

The operation of the SPDT switch 41 of this embodiment thus constructed is discussed below with reference to Table 3.

To close the SPST switch portion 42 and to open the FET 46, the variable-voltage generator 71 feeds the voltage Vα in the vicinity of the pinchoff voltage to the sources of the FETs 43 and 46. The FET 43 becomes almost non-conductive, thereby closing the SPST switch portion 42, and the other FET 46 becomes almost non-conductive, thereby opening. The SPST switch portion 42 operates as an attenuator in the same manner as the fourth embodiment.

To open the SPST switch portion 42 and to close the FET 46, the variable-voltage generator 71 applies the ground voltage (0 V) to the sources of the FETs 43 and 46. The FET 43 is turned on, opening the SPST switch portion 42, and the other FET 46 is turned on, thereby closing.

TABLE 3

| | Source voltage of FETs 43 and 46 |
|---|---|
| Terminals 1-2: SW (ON)<br>Terminals 1-3: SW (OFF) | Vα [V] |
| Terminals 1-2: SW (OFF)<br>Terminals 1-3: SW (ON) | 0 [V] |

The variable attenuator of the sixth embodiment provides the same advantages as those of the fourth embodiment. In this embodiment, the gates of the FETs 43 and 46 are connected to the ground 73, and the variable-voltage generator 71 is connected to the sources of the FETs 43 and 46. Further, in this arrangement, a single voltage controlling terminal between the FETs 43 and 46 is used, eliminating the need for connecting the voltage controlling terminal to each of the two FETs as in the fourth embodiment. Compared with the fourth embodiment, the sixth embodiment is simple in construction and involves low manufacturing costs.

Figure 8:
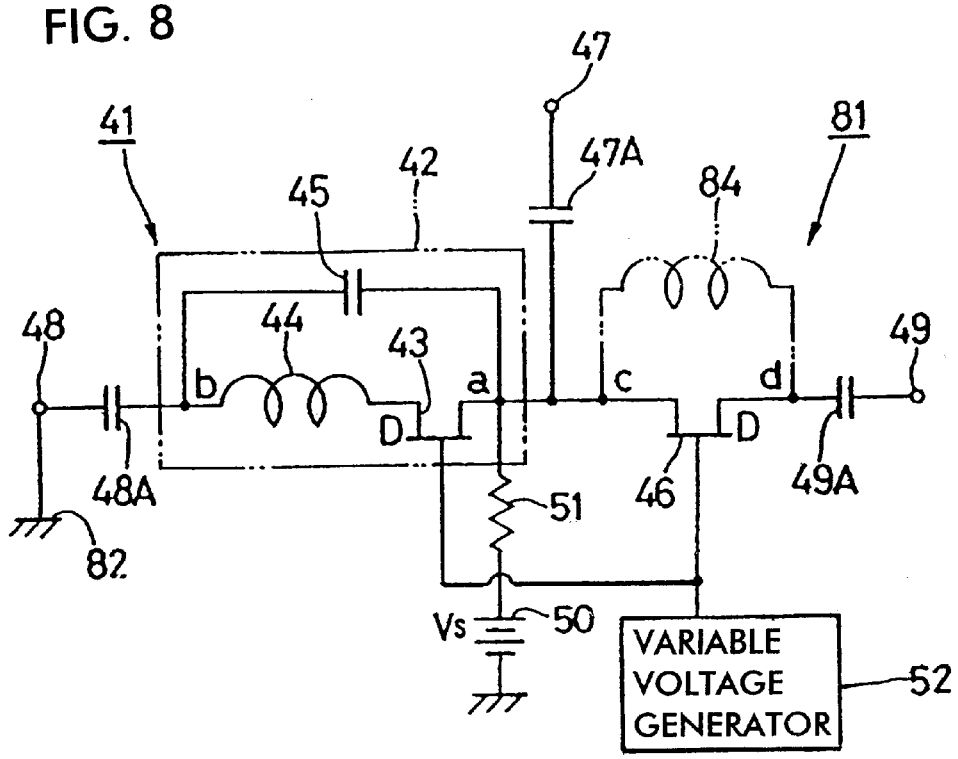
FIG. 8 is an electronic circuit diagram of an SPST switch in which a variable attenuator in accordance with a seventh embodiment of the present invention is implemented.

FIG. 8 illustrates an SPST switch with a variable attenuator in accordance with a seventh embodiment, and the feature of the seventh embodiment lies in that one of the second and third terminals of an SPDT switch is connected to a high-frequency ground to ground a high-frequency signal. In the seventh embodiment, components identical to those described in connection with the fourth embodiment are designated with the same reference numerals, and the discussion thereof is omitted here.

In the seventh embodiment, an SPST switch 81 is formed by connecting the second terminal 48 in the SPDT switch 41 in the fourth embodiment to ground 82. A capacitive element 48A is connected between the SPST switch portion 42 and ground 82.

The variable attenuator of the seventh embodiment presents the same advantages as those of the fourth embodiment. Since the second terminal 48 of the SPDT switch 41 is connected to the ground 82 in this embodiment, the SPST switch portion 42 is opened when the connection between the first and third terminals 47 and 49 is closed, and the SPST switch portion 42 is closed when the circuit between the first and third terminals 47 and 49 is opened. The variable attenuation range is thus increased.

Figure 9:
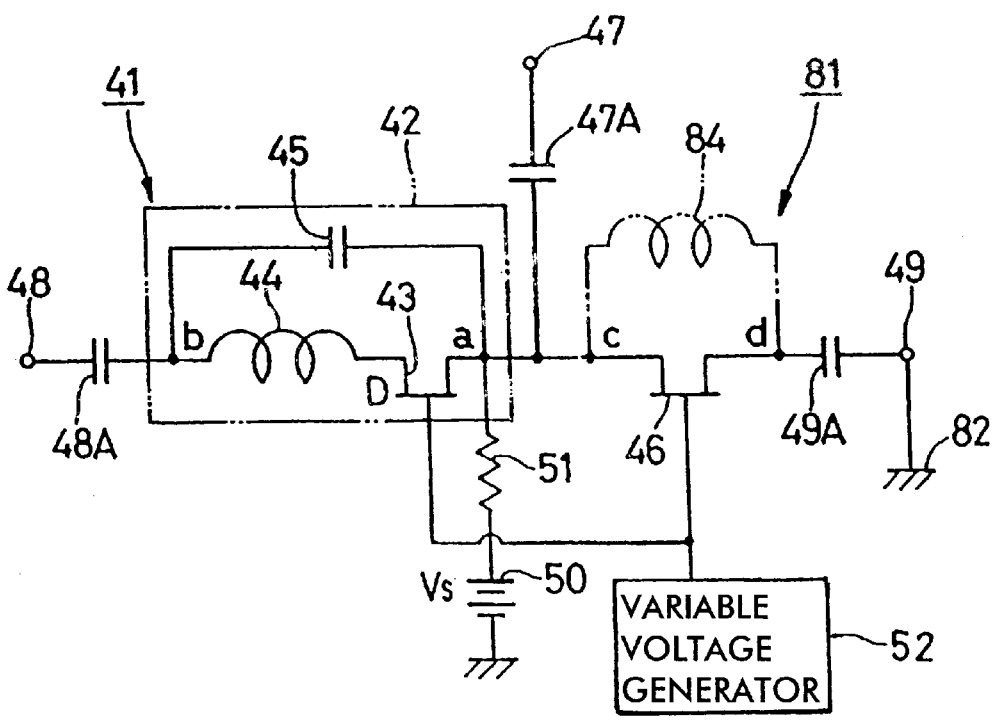
FIG. 9 is an electronic circuit diagram of an SPST switch in which a variable attenuator in accordance with a first modification of the seventh embodiment of the present invention is implemented.

The second terminal 48 is connected to ground 82 in the seventh embodiment, and alternatively, the third terminal 49 rather than the second terminal 48 may be connected to ground 82 as shown in a first modification in FIG. 9.

Figure 10:
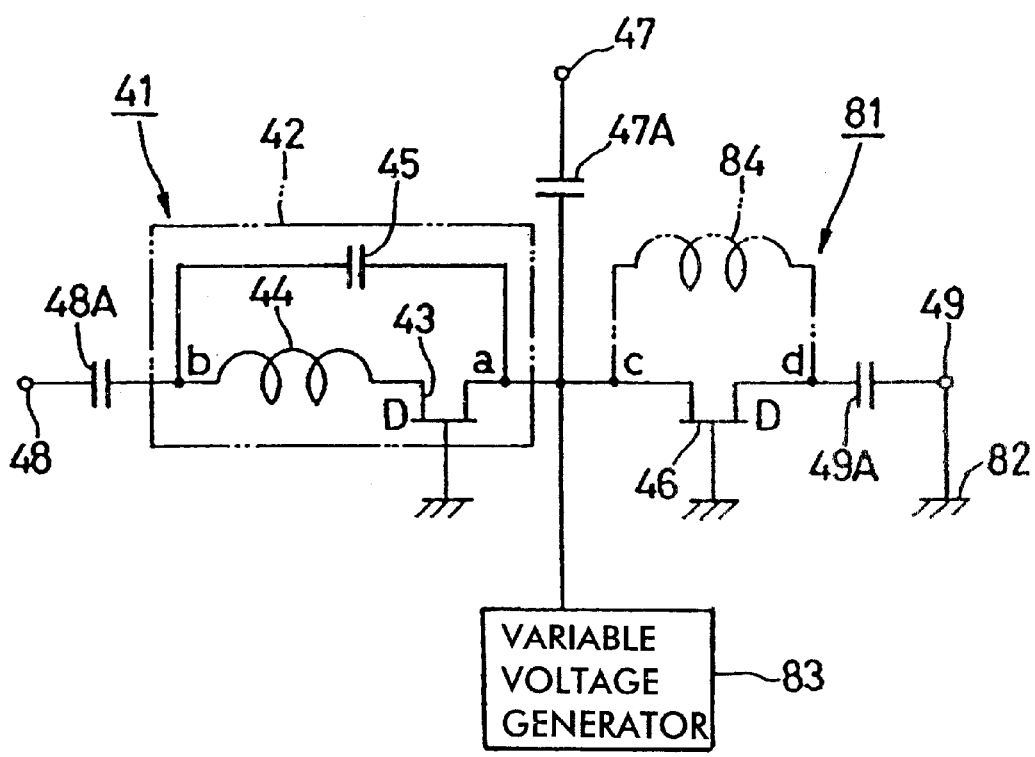
FIG. 10 is an electronic circuit diagram of an SPST switch in which a variable attenuator in accordance with a second modification of the seventh embodiment of the present invention is implemented.

In a second modification illustrated in FIG. 10, the gates of the FETs 43 and 46 may be grounded, and a variable-voltage generator 83, like the variable-voltage generator 71 in the sixth embodiment, may be connected to the sources of the FETs 43 and 46.

As represented by a two-dot and dash chain line in FIG. 8 through FIG. 10, an inductive element 84, like the inductive element 61 in the fifth embodiment, may be configured in parallel with the FET 46 with both ends thereof respectively connected to the source and the drain of the FET 46. In this way, the variable attenuation range is further expanded.

Figure 11:
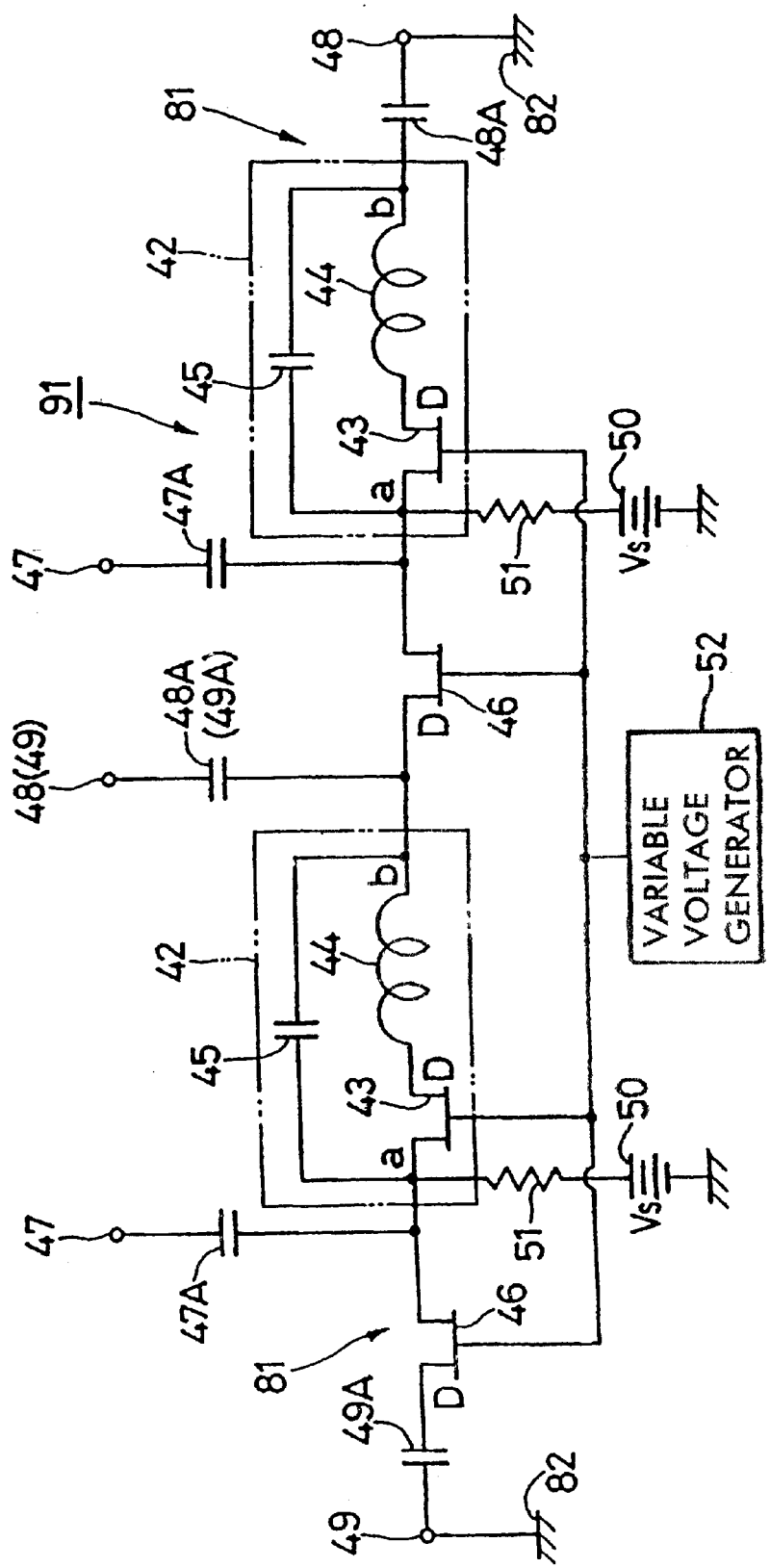
FIG. 11 is an electronic circuit diagram of an SPDT switch in which a variable attenuator in accordance with a third modification of the seventh embodiment of the present invention is implemented.

In a third modification illustrated in FIG. 11, an SPDT switch 91 is formed by connecting two SPST switches 81 of the seventh embodiment in series. In this case, the second terminal 48 of the one SPST switch 81 is connected to the third terminal 49 of the other SPST switch 81, and capacitive elements 48A and 49A respectively connected to the terminals 48 and 49 share a single capacitive element. In this way, the variable attenuation range is expanded more.

Figure 12:
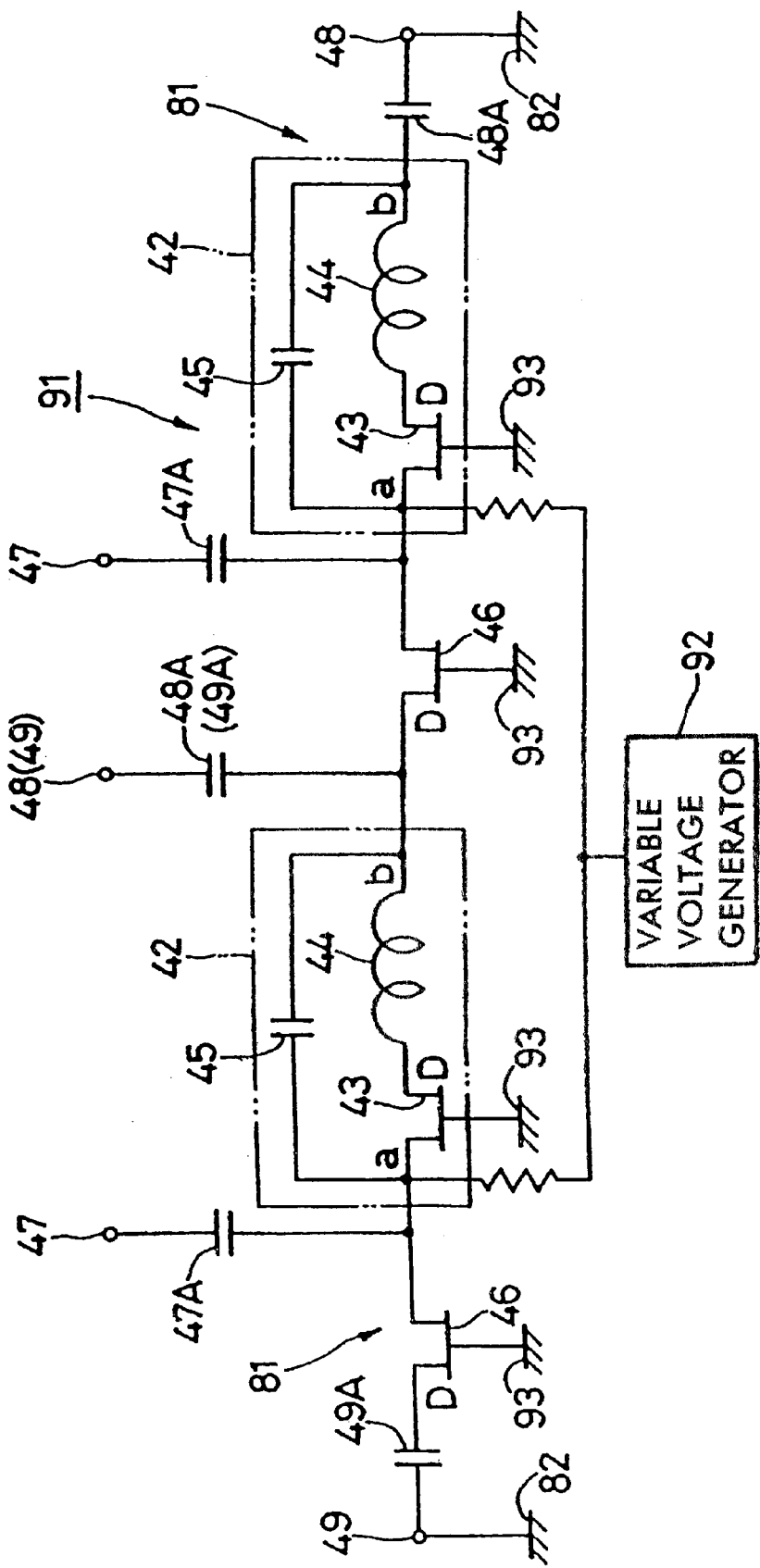
FIG. 12 is an electronic circuit diagram of an SPDT switch in which a variable attenuator in accordance with a fourth modification of the seventh embodiment of the present invention is implemented.

In a fourth modification illustrated in FIG. 12, a variable-voltage generator 92 is connected to the sources of the FETs 43 and 46, and the gates of the FETs 43 and 46 are connected together to a ground 93. In each of the third and fourth modifications respectively illustrated in FIG. 11 and FIG. 12, an inductive element (not shown) may be connected in parallel with the FET 46 as in the fifth embodiment, and three or more SPST switches 81 may be connected in series to form an SPDT switch.

Figure 13:
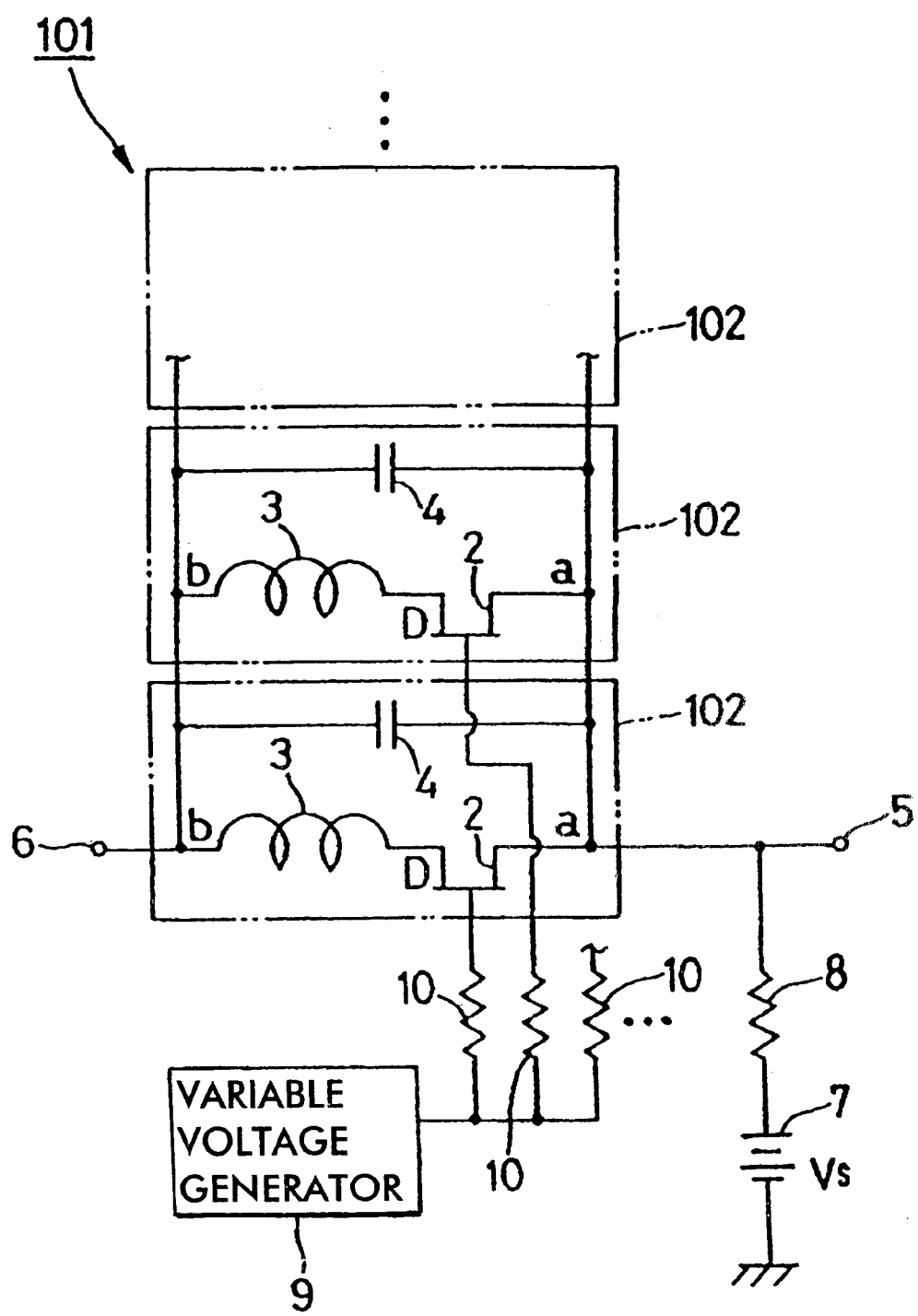
FIG. 13 is an electronic circuit diagram of an SPST switch in which a variable attenuator in accordance with an eighth embodiment of the present invention is implemented.

FIG. 13 illustrates an SPST switch with a variable attenuator in accordance with an eighth embodiment of the present invention, and the feature of the eighth embodiment lies in that a plurality of attenuator modules is connected in parallel. In the eighth embodiment, components identical to those described in connection with the first embodiment are designated with the same reference numerals, and the discussion thereof is omitted here.

An SPST switch 101 of the eighth embodiment may include a plurality (two, for example) of SPST switch modules 102 connected in parallel, each SPST switch module including, like the SPST switch 1 in the first embodiment, the FET 2, the inductive element 3, and the capacitive element 4.

The eighth embodiment provides the same advantages as those of the first embodiment. Since the SPST switch 101 is constructed by connecting the plurality of SPST modules 102 in parallel in this embodiment, permissible power transmitted thereacross becomes larger than in the first embodiment, and a large power is thus attenuated.

A plurality of SPST modules may be connected in parallel in each of the second through seventh embodiments.

In each of the above embodiments, the drain of the FET is connected to the inductive element, but alternatively, the source of the FET may be connected to the inductive element.

Since the drain and the source are substantially symmetrically arranged with respect to the gate in a typical FET, the drain may be used as a source, and the source may be used as a drain. In each of the above embodiments, the connection of the drain and source is not limited to the one described, and the drain and the source may be reversed. In this case, the gate voltage refers to a voltage difference between the gate and the drain.

As described above, the variable attenuator includes the FET, the inductive element connected to one of the source and the drain of the FET, the capacitive element connected in parallel with the series connection of the inductive element and the FET, the first terminal and a second terminal respectively connected to both ends of the capacitive element, and the attenuation setting unit which variably sets the amount of attenuation to a signal transmitted across the first terminal and the second terminal by varying the gate voltage of the FET. With the FET set in the vicinity of pinchoff, and with the two terminals connected, the attenuation setting unit variably sets the amount of attenuation. Since the attenuator is integrated into the SPST switch including the FET, the inductive element, and the capacitive element, there is no need for separately arranging an FET for attenuation purposes as in the conventional art, and the entire attenuator is made compact in size and low in manufacturing costs.

Since the attenuator is formed of a resonance type SPST switch, the attenuator has a wide range of attenuation and a large amount of attenuation compared with the case in which an attenuator is formed of an FET alone.

The variable attenuator can further include a constant-voltage source, connected to one of the source and the drain of the FET, for supplying a constant voltage. The attenuation setting unit is the variable-voltage generator which is connected to the gate of the FET to variably set the gate voltage of the FET. The voltage difference between the constant voltage provided by the constant-voltage source and the voltage provided by the variable-voltage generator applied to the FET as a gate voltage, thereby variably sets the amount of attenuation between the two terminals.

If the gate of the FET is grounded, the attenuation setting unit is a variable-voltage generator which is connected to one of the source and the drain of the FET to variably set the voltage of the one of the source and the drain of the FET. If the variable-voltage by the variable-voltage generator is applied to the FET as the gate voltage, the amount of attenuation between the two terminals can be variably set. For this reason, the amount of attenuation is set by connecting the single variable-voltage generator to the one of the source and the drain of the FET.

The variable attenuator includes the SPDT switch formed of the first FET, the first inductive element, and the first capacitive element, and the second FET, the second inductive element, and the second capacitive element, the voltage switch which makes or breaks the circuit between the first terminal and the third terminal by varying the voltage of the gate of the second FET, and the attenuation setting unit which variably sets the amount of attenuation to a signal transmitted across the first terminal and the second terminal by varying the gate voltage of the first FET. In this arrangement, the circuit between the first terminal and the third terminal is broken when the voltage switch turns on the second FET. The circuit between the first terminal and the third terminal is made when the voltage switch turns off the second FET. The circuit between the first terminal and the second terminal is broken when the attenuation setting unit turns on the first FET, and the circuit between the first terminal and the second terminal is made when the attenuation setting unit turns off the first FET.

The variable attenuator may include the SPDT switch including the FET, the inductive element, the capacitive element, and the other FET, and the attenuation setting unit which variably sets the amount of attenuation to a signal transmitted across the first terminal and the second terminal by varying the gate voltages of the two FETs. In this arrangement, the circuit between the first terminal and the second terminal is broken and the circuit between the first terminal and the third terminal is made when the attenuation setting unit causes the two FETs to turn on. The circuit between the first terminal and the second terminal is made and the circuit between the first terminal and the third terminal is broken when the attenuation setting unit causes the two FETs to turn off.

When the resonance type SPST is formed of the FET, the inductive element, and the capacitive element, and the attenuation setting unit operates the FET of the SPST in the vicinity of pinchoff, and thus the amount of attenuation between the first terminal and the second terminal is variably set. When the SPST switch operates in coordination with the other FET, variations in the impedance with respect to the first terminal are controlled.

The variable attenuator may further include another inductive element connected between the drain and source of the other FET in parallel with the other FET, and when the other FET is turned off, the off capacitance of the other FET and the other inductive element are resonated in parallel, thereby increasing isolation between the first terminal and the third terminal.

When the gates of the two FETs are grounded, and the attenuation setting unit is the variable-voltage generator, the latter may be connected to the first terminal that connects the two FETs to variably set the voltage of one of the source and the drain of the two FETs. The voltage difference between the ground voltage and the voltage of the variable-voltage generator is supplied to the two FETs, thereby variably setting the amount of attenuation between the first terminal and the second terminal. For this reason, the amount of attenuation is set by connecting the single variable-voltage generator to the sources or the drains of the two FETs.

One of the second terminal and the third terminal may be connected to a high-frequency ground, and the SPST switch is formed between the other of the second terminal and the third terminal, and the first terminal. When the third terminal is connected to the high-frequency ground, for example, the circuit between the first terminal and the third terminal is broken while the circuit between the first terminal and the second terminal is made. The circuit between the first terminal and the third terminal is made while the circuit between the first terminal and the second terminal is broken, and the first terminal is grounded. For this reason, isolation between the conductive state between the first and second terminals and the non-conductive state between the first and second terminals increases, thereby widening a range within which attenuation varies.

When the SPDT switch is formed of a plurality of SPST switches in series connection, permissible attenuation range is widened and power transmitted thereacross is increased.

When the variable attenuator includes a plurality of attenuator modules connected in parallel, each module including the FET, the inductive element, and the capacitive element, and the power transmitted across the terminals is thus increased, and a larger power is thus attenuated.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A variable attenuator comprising:
   a FET;
   an inductive element connected to one of the source and the drain of the FET thereby forming a series connection of the inductive element and the FET;
   a capacitive element connected in parallel with the series connection of the inductive element and the FET;
   a first terminal and a second terminal respectively connected to both ends of the capacitive element;
   an attenuation setting unit which variably sets an amount of attenuation to a signal flowing between the first terminal and the second terminal by varying a voltage difference between the gate of the FET and one of the source and drain; and
   a constant potential connected to the gate of the FET, wherein the attenuation setting unit is a variable-voltage generator which is connected to the source or drain of the FET to variably set the source or drain voltage of the FET.

2. A switching element with variable attenuation comprising:
   a first SPST switch comprising a first inductive element connected to one of the source and the drain of a first FET thereby forming a first series connection of the first inductive element and the first FET, a first capacitive element connected in parallel with the first series connection of the first inductive element and the first FET, a first terminal and a second terminal respectively connected to both ends of the first capacitive element, and an attenuation setting unit which variably sets an amount of attenuation to a signal flowing between the first terminal and the second terminal by varying a voltage difference between the gate of the first FET and one of the source and drain;
   a second SPST switch comprising a second inductive element connected to one of the source and the drain of a second FET thereby forming a second series connection of the second inductive element and the second FET, a second capacitive element connected in parallel with the second series connection of the second inductive element and the second FET, a third terminal and a fourth terminal respectively connected to both ends of the second capacitive element, the third terminal being connected to the second terminal; and
   a voltage generator coupled to the gate of the second FET, and supplying a selected one of two constant voltage levels to the gate of the second FET, whereby said attenuation setting unit controls the conductive state of the first SPST switch and the voltage generator controls the conductive state of the second SPST switch.

3. A switching element with variable attenuation comprising:
   a first SPST switch comprising a first inductive element connected to one of the source and the drain of a first FET thereby forming a first series connection of the first inductive element and the first FET, a first capacitive element connected in parallel with the first series connection of the first inductive element and the first FET, a first terminal and a second terminal respectively connected to both ends of the first capacitive element, and an attenuation setting unit which variably sets an amount of attenuation to a signal flowing between the first terminal and the second terminal by varying a voltage difference between the gate of the first FET and one of the source and drain; and
   a second FET having one of its drains and source coupled to one of the drain and source of the first FET, a potential difference between the gate of the second FET and its drain or source being determined by said attenuation setting unit, the attenuation setting unit controlling the conductive state of the first SPST switch and the second FET,
   wherein the gates of said first and second FETs are coupled to a constant potential source and said attenuation setting unit is a variable voltage generator coupled to a common connection comprising at least one of a source and drain of each of the first and second FETs.

4. The switching element of claim 3, wherein the gates of said first and second FETs are connected to ground potential.

5. A switching element with variable attenuation comprising:
   a first SPST switch comprising a first inductive element connected to one of the source and the drain of a first FET thereby forming a first series connection of the first inductive element and the first FET, a first capacitive element connected in parallel with the first series connection of the first inductive element and the first FET, a first terminal and a second terminal respectively connected to both ends of the first capacitive element, and an attenuation setting unit which variably sets an amount of attenuation to a signal flowing between the first terminal and the second terminal by varying a voltage difference between the gate of the fist FET and one of the source and drain; and a second FET having one of its drains and source coupled to one of the drain and source of the first FET, a potential difference between the gate of the second FET and its drain or source being determined by said attenuation setting unit, the attenuation setting unit controlling the conductive state of the first SPST switch and the second FET, wherein said switching element has three terminals, a first terminal comprising a common connection comprising at least one of a source and drain of each of the first and second FETS, a second terminal comprising a common connection of said first capacitive element and said first inductive element and a third terminal comprising one of the source and drain of the second FET not connected to the common connection of said two FETS, and wherein one of said second and third terminals is connected to a constant potential source.

* * * * *